(12) United States Patent
Chen et al.

(10) Patent No.: US 11,903,133 B2
(45) Date of Patent: Feb. 13, 2024

(54) STRUCTURE FOR EMBEDDING AND PACKAGING MULTIPLE DEVICES BY LAYER AND METHOD FOR MANUFACTURING SAME

(71) Applicant: Zhuhai ACCESS Semiconductor Co., Ltd, Guangdong (CN)

(72) Inventors: Xianming Chen, Guangdong (CN); Lei Feng, Guangdong (CN); Gao Huang, Guangdong (CN); Benxia Huang, Guangdong (CN); Yejie Hong, Guangdong (CN)

(73) Assignee: ZHUHAI ACCESS SEMICONDUCTOR CO., LTD, Guangdong (CN)

( * ) Notice: Subject to any disclaimer, the term of this patent is extended or adjusted under 35 U.S.C. 154(b) by 0 days.

(21) Appl. No.: 17/955,683

(22) Filed: Sep. 29, 2022

(65) Prior Publication Data

US 2023/0189444 A1 Jun. 15, 2023

(30) Foreign Application Priority Data

Dec. 9, 2021 (CN) .......................... 202111518254.9

(51) Int. Cl.
*H05K 1/18* (2006.01)
*H05K 3/00* (2006.01)
*H05K 1/03* (2006.01)
*H05K 1/11* (2006.01)
*H05K 3/42* (2006.01)
*H05K 3/46* (2006.01)

(52) U.S. Cl.
CPC ............ *H05K 1/186* (2013.01); *H05K 1/0366* (2013.01); *H05K 1/113* (2013.01); *H05K 3/0035* (2013.01); *H05K 3/429* (2013.01); *H05K 3/4661* (2013.01); *H05K 2201/0129* (2013.01); *H05K 2201/0166* (2013.01); *H05K 2201/032* (2013.01); *H05K 2201/09509* (2013.01); *H05K 2203/061* (2013.01); *H05K 2203/308* (2013.01)

(58) Field of Classification Search
CPC ...... H05K 1/113; H05K 1/186; H05K 3/0035; H05K 3/429; H05K 3/4661
See application file for complete search history.

(56) References Cited

FOREIGN PATENT DOCUMENTS

CN 109686669 B 8/2021

*Primary Examiner* — Jeremy C Norris
(74) *Attorney, Agent, or Firm* — The PL Law Group, PLLC

(57) ABSTRACT

A method for manufacturing a structure for embedding and packaging multiple devices by layer includes preparing a polymer supporting frame, mounting a first device in a first device placement mouth frame to form a first packaging layer, forming a first circuit layer and a second circuit layer, forming a second conductive copper pillar layer and a second sacrificial copper pillar layer, forming a second insulating layer on the first circuit layer, and forming a third insulating layer on the second circuit layer, forming a second device placement mouth frame vertically overlapped with the first device placement mouth frame, mounting a second device and a third device in the second device placement mouth frame to form a second packaging layer, forming a third circuit layer on the second insulating layer. A terminal of the second device and a terminal of the third device are respectively communicated with the third circuit layer.

20 Claims, 6 Drawing Sheets

STRUCTURE FOR EMBEDDING AND PACKAGING MULTIPLE DEVICES BY LAYER AND METHOD FOR MANUFACTURING SAME

CROSS REFERENCE IO RELATED APPLICATIONS AND CLAIM OF PRIORITY

The present application claims the benefit of Chinese Patent Application No. 202111518254.9 filed on Dec. 9, 2021 at the Chinese Intellectual Property Office, the disclosures of which are incorporated by reference herein in their entirety.

BACKGROUND

1. Technical Field

The present invention relates to packaging structures for electronic devices, and more particularly, to a structure for embedding and packaging multiple devices by layer and a method for manufacturing the same.

2. Background of the Invention

Currently, in the field of panel-level embedding and packaging, it has been possible for embedding and packaging a plurality of components, but there are still certain limitations, for example, the plurality of components can only be embedded and packaged in one layer inside a substrate at one time, so the needs for further miniaturization cannot be met due to a large horizontal size. Moreover, it is also impossible to achieve the most desirable embedding and packaging structure that fits the actual product structure and wiring design; hence the wiring difficulty and wire length are increased, and the electrical performances are deteriorated.

SUMMARY

An embodiment of the present invention provides a structure for embedding and packaging multiple devices by layer and a method for manufacturing the same in order to solve the above technical problems. According to the actual demands for a packaging module, a plurality of components may be embedded and packaged in different layers of the substrate, which can effectively reduce the size in an XY direction and achieve higher-density integrated package, and at the same time can reduce the wiring difficulty, thereby realizing an electric connection at the shortest distance between each device and the substrate and improving the electrical performances of the packaging module.

A first aspect of the present invention relates to a method for manufacturing a structure for embedding and packaging multiple devices by layer. The method includes the following steps:

(a) preparing a polymer supporting frame, the polymer supporting frame including a first insulating layer, a first conductive copper pillar layer penetrating the first insulating layer, and a first device placement mouth frame;

(b) mounting a first device on the bottom of the first device placement mouth frame, and forming a first packaging layer in a gap between the first device placement mouth frame and the first device;

(c) respectively forming a first circuit layer and a second circuit layer on upper and lower surfaces of the first insulating layer, the first circuit layer including a first conductive circuit layer and a first sacrificial circuit layer, wherein the first sacrificial circuit layer covers the first device placement mouth frame, a terminal of the first device is communicated with the second circuit layer, and the first conductive circuit layer and the second circuit layer are conductively connected through the first conductive copper pillar layer;

(d) forming a second copper pillar layer on the first circuit layer, the second copper pillar layer including a second conductive copper pillar layer and a second sacrificial copper pillar layer, wherein the second sacrificial copper pillar layer is located on the first sacrificial circuit layer;

(e) laminating an insulating material on the first circuit layer and the second copper pillar layer, thinning the insulating material to expose the end of the second copper pillar layer to form a second insulating layer, and laminating the insulating material on the second circuit layer to form a third insulating layer;

(f) etching the first sacrificial circuit layer and the second sacrificial copper pillar layer to form a second device placement mouth frame, the second device placement mouth frame being vertically overlapped with the first device placement mouth frame;

(g) mounting a second device and a third device on the bottom of the second device placement mouth frame, and forming a second packaging layer in a gap between the second device placement mouth frame and the second device and in a gap between the second device placement mouth frame and the third device, wherein the second device and the third device are vertically overlapped with the first device respectively in a layered manner; and (h) forming a third circuit layer on the upper surface of the second insulating layer, wherein a terminal of the second device and a terminal of the third device are respectively communicated with the third circuit layer, and the first conductive circuit layer and the third circuit layer are conductively connected through the second conductive copper pillar layer.

In some embodiments, the method further includes:

(i) following step (h), laminating an insulating material on the third circuit layer to form a fourth insulating layer, and forming a first blind hole and a second blind hole in the third insulating layer and the fourth insulating layer, respectively;

(j) forming a first via hole and a fifth circuit layer in the first blind hole and in the surface of the third insulating layer respectively, and forming a second via hole and a fourth circuit layer in the second blind hole and in the surface of the fourth insulating layer respectively, wherein the second circuit layer and the fifth circuit layer are conductively connected through the first via hole, and the third circuit layer and the fourth circuit layer are conductively connected through the second via hole; and (k) forming a first solder resist layer on the fourth circuit layer, forming a second solder resist layer on the fifth circuit layer, and treating exposed metal surfaces in the first solder resist layer and the second solder resist layer respectively to form a first metal surface treatment layer and a second metal surface treatment layer.

In some embodiments, step (b) includes:

(b1) arranging a first adhesive layer on the bottom of the first insulating layer;

(b2) attaching a terminal surface of the first device to the first adhesive layer exposed in the first device placement mouth frame;

(b3) laminating a packaging material on the upper surface of the first insulating layer and in a gap between the first device and the first device placement mouth frame, and curing the packaging material to form a first packaging layer;

(b4) thinning the first packaging layer to expose the end of the first conductive copper pillar layer; and (b5) removing the first adhesive layer.

In some embodiments, the first adhesive layer includes a single-sided adhesive tape.

In some embodiments, step (g) includes: arranging an adhesive material at the bottom of the second device placement mouth frame, and then mounting the backside of the second device and the backside of the third device onto the adhesive material respectively, such that the second device and the third device are mounted on the bottom of the second device placement mouth frame.

In some embodiments, step (g) includes: arranging the adhesive material at the backside of the second device and the backside of the third device respectively, and then mounting the backside of the second device and the backside of the third device onto the bottom of the second device placement mouth frame respectively, such that the second device and the third device are mounted onto the bottom of the second device placement mouth frame.

In some embodiments, step (i) includes: forming the blind holes by means of laser processing.

In some embodiments, the insulating material is selected from pure resin or resin containing glass fiber.

In some embodiments, the first packaging layer and the second packaging layer are respectively made of a thermosetting dielectric material or a photosensitive dielectric material.

In some embodiments, the first device, the second device and the third device respectively include one or more of an active device and a passive device.

A second aspect of the present invention relates to a method for manufacturing a structure for embedding and packaging multiple devices by layer. The method includes the following steps:

(a) preparing a polymer supporting frame, the polymer supporting frame including a first insulating layer, a first conductive copper pillar layer penetrating the first insulating layer, and a first device placement mouth frame;

(b) mounting a first device onto the bottom of the first device placement mouth frame, and forming a first packaging layer in a gap between the first device placement mouth frame and the first device;

(c) forming a second circuit layer on the lower surface of the first insulating layer, and a fifth insulating layer on the upper surface of the first insulating layer, wherein the fifth insulating layer includes a sixth circuit layer located in the lower surface of the fifth insulating layer and a third conductive copper pillar layer located on the sixth circuit layer, a terminal of the first device is communicated with the sixth circuit layer, and the sixth circuit layer and the second circuit layer are conductively connected through the first conductive copper pillar layer;

(d) forming a first circuit layer on the upper surface of the fifth insulating layer, the first circuit layer including a first conductive circuit layer and a first sacrificial circuit layer, wherein the first conductive circuit layer and the sixth circuit layer are conductively connected through the third conductive copper pillar layer, and the positions of the first sacrificial circuit layer and the first device placement mouth frame in a longitudinal direction are the same;

(e) forming a second copper pillar layer on the first circuit layer, the second copper pillar layer including a second conductive copper pillar layer and a second sacrificial copper pillar layer, wherein the second sacrificial copper pillar layer is located on the first sacrificial circuit layer;

(f) laminating an insulating material on the first circuit layer and the second copper pillar layer, thinning the insulating material to expose the end of the second copper pillar layer to form a second insulating layer, and laminating the insulating material on the second circuit layer to form a third insulating layer;

(g) etching the first sacrificial circuit layer and the second sacrificial copper pillar layer to form a second device placement mouth frame, wherein the second device placement mouth frame is vertically overlapped with the first device placement mouth frame;

(h) mounting a second device and a third device onto the bottom of the second device placement mouth frame, and forming a second packaging layer on the upper surface of the second insulating layer, and in a gap between the second device placement mouth frame and the second device and in a gap between the second device placement mouth frame and the third device, wherein the first device vertically overlapped with the second device and the third device respectively in a layered manner; and (i) forming a third blind hole in the second packaging layer, forming a third via hole in the third blind hole, and forming a third circuit layer on the surface of the second packaging layer and the surface of the third via hole layer, wherein a terminal of the second device and a terminal of the third device are conductively connected to the third circuit layer respectively through the third via hole, and the first conductive circuit layer and the third circuit layer are conductively connected through the second conductive copper pillar layer and the third via hole.

In some embodiments, the method further includes:

(j) following step (i), laminating an insulating material on the third circuit layer to form a fourth insulating layer, and forming a first blind hole and a second blind hole in the third insulating layer and the fourth insulating layer, respectively;

(k) forming a first via hole and a fifth circuit layer in the first blind hole and in the surface of the third insulating layer respectively, and forming a second via hole and a fourth circuit layer in the second blind hole and in the surface of the fourth insulating layer respectively, wherein the second circuit layer and the fifth circuit layer are conductively connected through the first via hole, and the third circuit layer and the fourth circuit layer are conductively connected through the second via hole; and (k) forming a first solder resist layer on the fourth circuit layer, forming a second solder resist layer on the fifth circuit layer, and treating exposed metal surfaces in the first solder resist layer and the second solder resist layer respectively to form a first metal surface treatment layer and a second metal surface treatment layer.

A third aspect of the present invention relates to a structure for embedding and packaging multiple devices by layer, which is manufactured by using the method for manufacturing the structure for embedding and packaging multiple devices by layer according to the first aspect.

In some embodiments, the structure for embedding and packaging multiple devices by layer includes a first insulating layer and a second insulating layer located above the first insulating layer; the first insulating layer includes a first conductive copper pillar layer and a first device placement mouth frame which penetrate the first insulating layer in a height direction, wherein a first device is mounted onto the bottom of the first device placement mouth frame, and a first packaging layer is arranged in a gap between the first device placement mouth frame and the first device; the second insulating layer includes a second device placement mouth frame, a first conductive circuit layer located in the lower surface of the second insulating layer, and a second conductive copper pillar layer located on the first conductive circuit layer, wherein a second device and a third device are mounted onto the bottom of the second device placement mouth frame, a second packaging layer is arranged in a gap between the second device placement mouth frame and the second device and in a gap between the second device placement mouth frame and the third device, and the first device placement mouth frame is vertically overlapped with the second device placement mouth frame; and the first device is vertically overlapped with the second device and the third device in a layered manner.

In the embodiments, the structure for embedding and packaging multiple devices by layer further includes a third insulating layer located below the first insulating layer and a fourth insulating layer located above the second insulating layer, wherein the third insulating layer includes a second circuit layer located in the upper surface of the third insulating layer, a first via hole in the second circuit layer, and a fifth circuit layer located on the lower surface of the third insulating layer; the second circuit layer and the fifth circuit layer are conductively connected through the first via hole; the first conductive circuit layer and the second circuit layer are conductively connected through the first conductive copper pillar layer; and a terminal of the first device is communicated with the second circuit layer; and the fourth insulating layer includes a third circuit layer located in the lower surface of the fourth insulating layer, a second via hole in the third circuit layer, and a fourth circuit layer on the upper surface of the fourth insulating layer, wherein a terminal of the second device and a terminal of the third device are respectively communicated with the third circuit layer, the third circuit layer and the fourth circuit layer are conductively connected through the second via hole, and the first conductive circuit layer and the third circuit layer are conductively connected through the second conductive copper pillar layer.

In some embodiments, the structure for embedding and packaging multiple devices by layer further includes a first solder resist layer and a second solder resist layer which are respectively formed on the fourth circuit layer and the fifth circuit layer, wherein a first metal surface treatment layer is arranged in the first solder resist layer, and a second metal surface treatment layer is arranged in the second solder resist layer.

A fourth aspect of the present invention relates to a structure for embedding and packaging multiple devices by layer, which is manufactured by using the method for manufacturing the structure for embedding and packaging multiple devices by layer according to the second aspect.

In some embodiments, the structure for embedding and packaging multiple devices by layer includes a first insulating layer, a fifth insulating layer located above the first insulating layer and a second insulating layer located above the fifth insulating layer; the first insulating layer includes a first conductive copper pillar layer and a first device placement mouth frame which penetrate the first insulating layer in a height direction, wherein a first device is mounted onto the bottom of the first device placement mouth frame, and a first packaging layer is arranged in a gap between the first device placement mouth frame and the first device; the fifth insulating layer includes a sixth circuit layer located in the lower surface of the fifth insulating layer, and a third conductive copper pillar layer located on the sixth circuit layer; the second insulating layer includes a second device placement mouth frame, a first conductive circuit layer located in the lower surface of the second insulating layer, and a second conductive copper pillar layer located on the first conductive circuit layer, wherein a second device and a third device are mounted onto the bottom of the second device placement mouth frame, and a second packaging layer is arranged on the upper surface of the second insulating layer, and in a gap between the second device placement mouth frame and the second device and in a gap between the second device placement mouth frame and the third device; the sixth circuit layer and the first conductive circuit layer are conductively connected through the third conductive copper pillar layer; a terminal of the first device is communicated with the sixth circuit layer; the first device placement mouth frame is vertically overlapped with the second device placement mouth frame; and the first device is vertically overlapped with the second device and the third device in a layered manner.

In some embodiments, the structure for embedding and packaging multiple devices by layer further includes a third insulating layer located below the first insulating layer and a fourth insulating layer located above the second insulating layer, wherein the third insulating layer includes a second circuit layer located in the upper surface of the third insulating layer, a first via hole in the second circuit layer, and a fifth circuit layer located on the lower surface of the third insulating layer; the second circuit layer and the fifth circuit layer are conductively connected through the first via hole; and the sixth conductive circuit layer and the second circuit layer are conductively connected through the first conductive copper pillar layer;

the fourth insulating layer includes a third circuit layer located in the lower surface of the fourth insulating layer, a second via hole in the third circuit layer, and a fourth circuit layer located on the upper surface of the fourth insulating layer, wherein the third circuit layer and the fourth circuit layer are conductively connected through the second via hole; a third via hole is formed in the second packaging layer; a terminal of the second device and a terminal of the third device are conductively connected to the third circuit layer respectively through the third via hole; and the first conductive circuit layer and the third circuit layer are conductively connected through the second conductive copper pillar layer and the third via hole.

In some embodiments, the structure for embedding and packaging multiple devices by layer further includes a first solder resist layer and a second solder resist layer which are respectively formed on the fourth circuit layer and the fifth circuit layer, wherein a first metal surface treatment layer is arranged in the first solder resist layer, and a second metal surface treatment layer is arranged in the second solder resist layer.

BRIEF DESCRIPTION OF THE DRAWINGS

For a better understanding of the present invention and an illustration of the embodiments of the present invention, a reference is made below, purely by way of example, to the accompanying drawings.

With specific reference to the accompanying drawings, it must be emphasized that the specific drawings are exemplary and only for purposes of illustratively discussing the preferred embodiments of the present invention, and presented for the purpose of providing the illustration that is believed to be the most useful and easiest to understand for describing the principles and conceptual aspects of the present invention. In this regard, no attempt is made to illustrate the structural details of the present invention in greater detail than is necessary for a basic understanding of the present invention; and the description referring to the accompanying drawings will enable those skilled in the art to appreciate how several forms of the present invention may actually be embodied. In drawings.

DETAILED DESCRIPTION OF THE EMBODIMENTS

With the continuous development of electronic technologies, electronic products tend to be highly functionalized and highly integrated. Since the miniaturization of components is close to the limit, how to reasonably package a plurality of components to achieve high-function and high-density integration has become an important research topic in the current industry. At the same time, due to cost and efficiency considerations, panel-level packaging has also become a current trend. In the process of manufacturing a substrate, the components are embedded inside the substrate, which can effectively reduce the package volume and improve the output efficiency, and meanwhile compared with wafer-level packaging, greatly reduces the cost. After continuous development and evolution, the panel-level embedded packaging technology has been used more and more widely, playing an increasingly important role in the field of semiconductor packaging. At the same time, the panel-level embedded packaging technology has also been developed. In the current panel-level embedded packaging field, the embedded packaging of the plurality of components has been realized, but there are still certain limitations.

Figure 1:
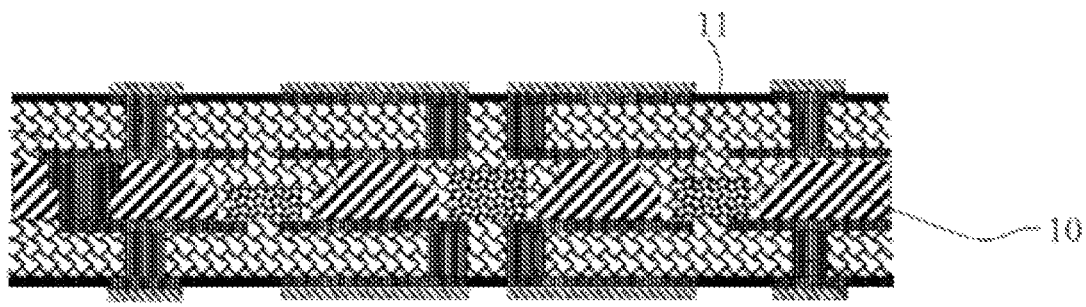
FIG. 1 is a schematic sectional view of an integrated circuit packaging method and a packaging structure in the prior art.

The existing panel-level embedded packaging schemes can already realize the embedded packaging of a plurality of chips and other components, e.g., as shown in a panel-level embedded packaging scheme disclosed in the prior art CN109686669B. As shown in FIG. 1, in this packaging structure, a plurality of components 11 is embedded in a frame 10 in an intermediate layer of the substrate at one time; and after packaging, single-sided fan-out is performed, followed by double-sided layer-addition. This scheme has certain limitations. All components must be embedded and packaged in an initial layer at one time, so a plurality of chips and other components cannot be embedded and packaged in different layers. Since only is the plurality of components embedded and packaged in the same layer inside the substrate at one time, the development needs for the miniaturization of embedded package cannot be met as a result of a large horizontal size, and it is also impossible to achieve the most reasonable embedded packaging structure according to the actual product structure and wiring design, resulting in the increase of wiring difficulty and wire length, and affecting the electrical performances.

In order to solve the above problems, the present invention provides a structure for embedding and packaging multiple devices by layer and a method for manufacturing the same, which will be described in detail below with reference to the accompanying drawings.

Figure 2:
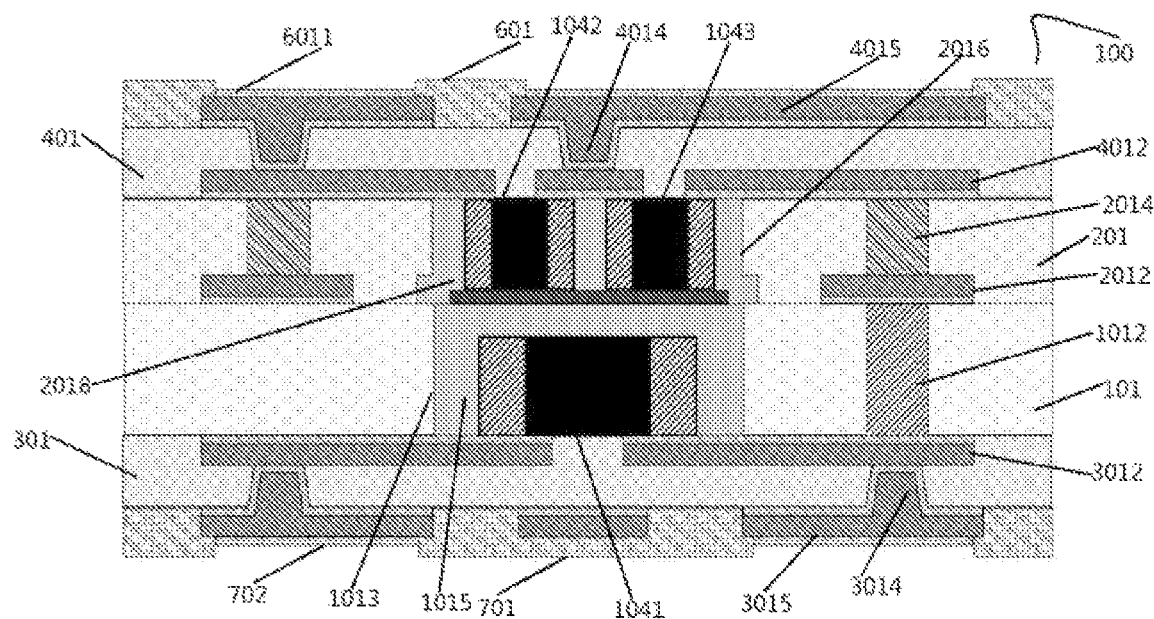
FIG. 2 is a schematic sectional view of a multi-media layered embedded packaging structure according to one embodiment of the present invention.

Referring to FIG. 2, a schematic sectional view of a structure for embedding and packaging multiple devices by layer 100 is shown. The packaging structure 100 includes a first insulating layer 101 and a second insulating layer 201 located above the first insulating layer 101. The first insulating layer 101 and the second insulating layer 201 may be made of the same material, or different materials. The first insulating layer 101 and the second insulating layer 201 may be made of pure resin or resin containing glass fiber, respectively. Preferably, the first insulating layer is made of polyimide, epoxy resin, bismaleimide triazine (BT) resin, ceramic filler, glass fiber or a combination thereof, and the second insulating layer is made of resin containing glass fiber.

The first insulating layer 101 includes a first conductive copper pillar layer 1012 penetrating the first insulating layer 101 in a height direction, and a first device placement mouth frame 1013, wherein a first device 1041 is mounted onto the bottom of the first device placement mouth frame 1013, and a first packaging layer 1015 is arranged in a gap between the first device placement mouth frame 1013 and the first device 1041. Generally, the devices mentioned in this embodiment may include one or more of active devices and passive devices. The device may be a bare chip, such as an integrated circuit driver chip (IC driver), a field effect transistor (FET), etc., or a passive device, such as a capacitor, resistor or inductor, or a single package after preliminary packaging, such as a ball grid array (BGA)/land grid array (LGA), etc., or a combination of a plurality of devices. Preferably, the first device 1041 is a passive device.

The conductive copper pillar layer mentioned in this embodiment may include at least one copper via pillar as an IO channel to realize conduction between layers. The plurality of copper via pillars may be the same or different in size and/or shape. Each copper via pillar may be a solid copper pillar or a hollow pillar with a copper-plated surface. Preferably, the first conductive copper pillar layer 1012 includes a plurality of copper via pillars as IO channels, and the end of the first conductive copper pillar layer may be flush with the first insulating layer, or may be higher than the first insulating layer.

The packaging layer mentioned in this embodiment may be made of a thermosetting dielectric material, and or a photosensitive dielectric material. Preferably, the first packaging layer 1015 is made of a thermosetting resin material; and the first packaging layer 1015 covers the first device 1041, can fix the first device 1041, and can prevent the first device 1041 from being short-circuited from the second device 1042 or the third device 1043.

The second insulating layer 201 includes a second device placement mouth frame 2016, a first conductive circuit layer 2012 located in the lower surface of the second insulating layer 201, and a second conductive copper pillar layer 2014 located on the first conductive circuit layer 2012. Preferably, the second conductive copper pillar layer 2014 includes a plurality of copper via pillars as IO channels, and the end of the second conductive copper pillar layer 2014 may be flush with the second insulating layer 201, or may be higher than the second insulating layer 201; and a second device 1042 and a third device 1043 are mounted onto the bottom of the second device placement mouth frame 2016. Preferably, the second device 1042 and the third device 1043 are both passive devices; and a second packaging layer 2018 is arranged in a gap between the second device placement mouth frame 2016 and the second device 1042 and a gap between the second device placement mouth frame 2016 and the third device 1043. Preferably, the second packaging layer 2018 is made of a thermosetting resin material and can fix the second device 1042 and the third device 1043; the first device placement mouth frame 1013 is vertically overlapped with the second device placement mouth frame 2016; and the first device 1041 is vertically overlapped with the second device 1042 and the third device 1043 in a layered manner. Therefore, the size of the substrate in an XY direction is effectively reduced, and the wiring difficulty is reduced while a higher-density integration package is realized; and an electric connection at the shortest distance between the device and the substrate is achieved, thereby improving the electrical performances of a packaging module.

The packaging structure 100 further includes a third insulating layer 301 located below the first insulating layer 101 and a fourth insulating layer 401 located above the second insulating layer 201. Preferably, the third insulating layer 301 and the fourth insulating layer 401 are made of pure resin respectively. The third insulating layer 301 includes a second circuit layer 3012 in the upper surface of the third insulating layer 301, a first via hole 3014 in the second circuit layer 3012, and a fifth circuit layer 3015 on the lower surface of the third insulating layer 301, wherein the second circuit layer 3012 and the fifth circuit layer 3015 are conductively connected through the first via hole 3014, the first conductive circuit layer 2012 and the second circuit layer 3012 are conductively connected through the first conductive copper pillar layer 1012, and a terminal of the first device is communicated with the second circuit layer.

The fourth insulating layer 401 includes a third circuit layer 4012 in the lower surface of the fourth insulating layer 401, a second via hole 4014 in the third circuit layer 4012, and a fourth wiring layer 4015 on the upper surface of the fourth insulating layer 401, wherein a terminal of the second device 1042 and a terminal of the third device 1043 are respectively communicated with the third circuit layer 4012; the third circuit layer 4012 and the fourth circuit layer 4015 are conductively connected through the second via hole 4014; and the first conductive circuit layer 1012 and the third circuit layer 4012 are conductively connected through the second conductive copper pillar layer 2014.

Referring to FIG. 2, the packaging structure 100 further includes a first solder resist layer 601 and a second solder resist layer 701 which are formed on the fourth circuit layer 4015 and the fifth circuit layer 3015, respectively, wherein a first metal surface treatment layer 6011 is arranged in the first solder resist layer 601, and a second metal surface treatment layer 7011 is arranged in the second solder resist layer 701.

Figure 3:
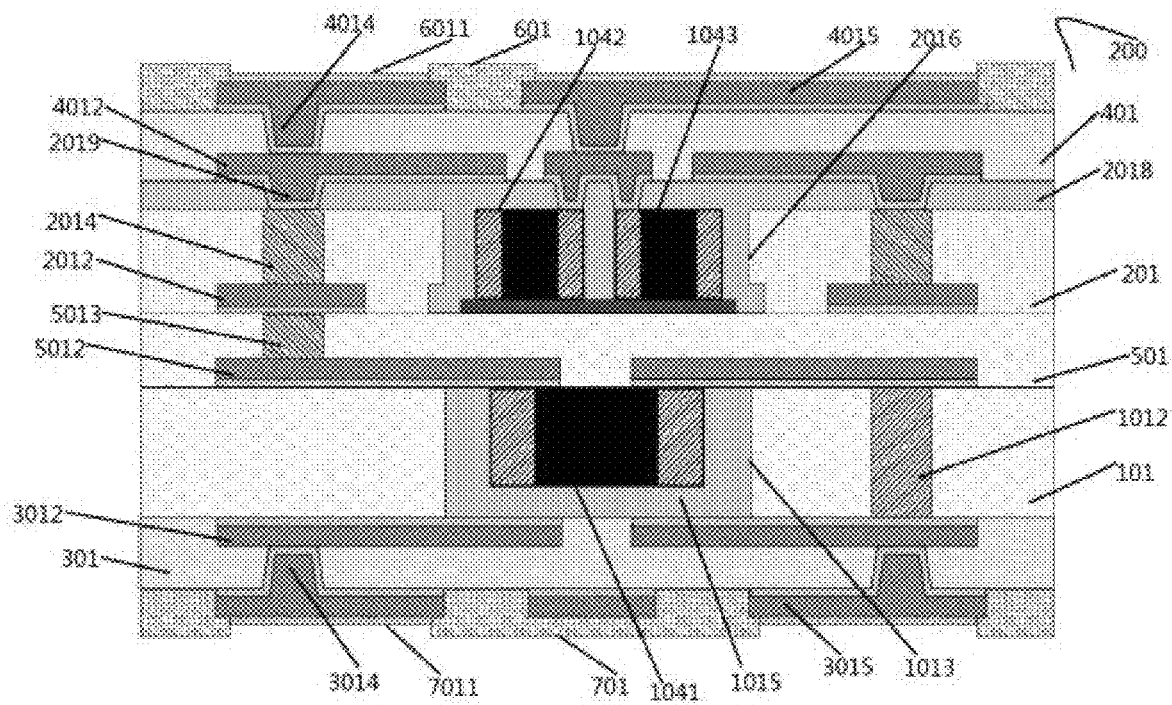
FIG. 3 is a schematic sectional view of a multi-media layered embedded packaging structure according to one embodiment of the present invention.

Referring to FIG. 3, a schematic sectional view of a structure for embedding and packaging multiple devices by layer 200 is shown. The packaging structure 200 differs from the packaging structure 100 in that: the packaging structure 200 includes a fifth insulating layer 501 located between the first insulating layer 101 and the second insulating layer 201. Preferably, the fifth insulating layer 501 is made of resin containing glass fiber. The fifth insulating layer 501 includes a sixth circuit layer 5012 located in the lower surface of the fifth insulating layer 501 and a third conductive copper pillar layer 5013 located on the sixth circuit layer 5012. Preferably, the third conductive copper pillar layer 5013 includes a plurality of copper via pillars as 10 channels, and the end of the third conductive copper pillar layer 5013 may be flush with the fifth insulating layer 501, or may be higher than the fifth insulating layer 501. The first conductive circuit layer 2012 and the sixth circuit layer 5012 are conductively connected through the third conductive copper pillar layer 5013. The first device 1041 is mounted onto the top of the first device placement mouth frame 1013, and a terminal of the first device 1041 is communicated with the sixth circuit layer 5012. A second packaging layer 2018 is provided on the upper surface of the second insulating layer 201, and a gap between the second device placement mouth frame 2016 and the second device 1042 and a gap between the second device placement mouth frame 2016 and the third device 1043. A third via hole 2019 is formed in the second packaging layer 2018. A terminal of the second device 1042 and a terminal of the third device 1043 are communicated with the third circuit layer 4012 respectively through the third via hole 2019; and the first conductive circuit layer 2012 and the third conductive circuit layer 4012 are conductively connected through the second conductive copper pillar layer 2014 and the third conductive hole 2019.

FIGS. 4A to 4M are schematic sectional views of intermediate structures in respective steps of a method for manufacturing a structure for embedding and packaging multiple devices by layer according to one embodiment of the present invention.

Figure 4A:
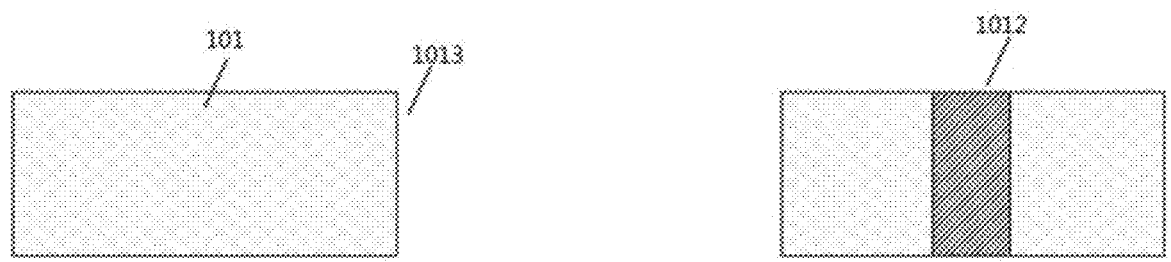
FIGS. 4A to 4M are schematic sectional views of intermediate structures in respective steps of a method for manufacturing a structure for embedding and packaging multiple devices by layer according to one embodiment of the present invention.

The method for manufacturing includes the following steps: preparing a polymer supporting frame, as shown in FIG. 4A. The polymer supporting frame includes a first insulating layer 101, a first conductive copper pillar layer 1012 penetrating the first insulating layer 101, and a first device placement mouth frame 1013. Generally, the first device placement mouth frame 1013 may penetrate through the first insulating layer 101. A plurality of first device placement mouth frames 1013 can be set for subsequent mounting of devices, and their sizes can be the same or different, and are determined according to the shapes and sizes of devices to be embedded.

Generally, a method for manufacturing a polymer supporting frame includes the following sub-steps:
  acquiring a sacrificial carrier;
  applying a copper seed layer on the sacrificial carrier;
  applying a corrosion-resisting layer on the sacrificial carrier;
  applying another copper seed layer;
  applying a photoresist layer;
  patterning photoresist as a pattern with copper via holes and loop-back strip-shaped via holes;
  electroplating copper in the pattern to form a first conductive copper pillar layer 1012 and a first loop-back strip-shaped copper pillar layer;
  stripping the photoresist layer;

laminating the first conductive copper pillar layer 1012 and the first loop-back strip-shaped copper pillar layer with an insulating material;

thinning and planarizing the insulating material to expose the ends of the first conductive copper pillar layer 1012 and the first loop-back strip-shaped copper pillar layer to form a first insulating layer 101;

removing the sacrificial carrier;

etching the corrosion-resisting layer;

applying an upper photoresist layer and a lower photoresist layer on upper and lower surfaces of the first insulating layer 101 respectively, exposing and developing the upper photoresist layer and the lower photoresist layer, and exposing a loop-back strip-shaped copper pillar in the first loop-back strip-shaped copper pillar layer; and etching the loop-back strip-shaped copper pillar and removing a dielectric material therein to form a first device placement mouth frame 1013, and removing the upper photoresist layer and the lower photoresist layer to obtain the polymer supporting frame.

Figure 4B:
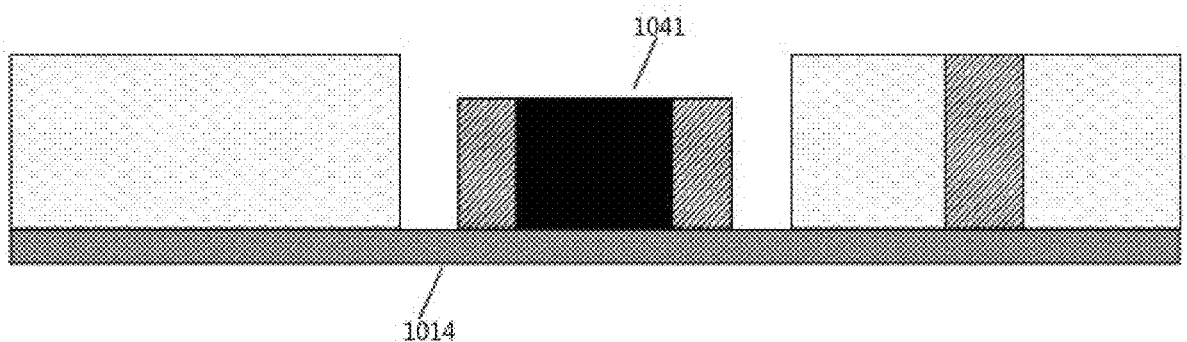

Next, as shown in FIG. 4B, a first adhesive layer 1014 is arranged at the bottom of the first insulating layer 101, and a terminal surface of the first device 1041 is attached to the first adhesive layer 1014 exposed in the first device placement mouth frame 1013. In general cases, the first adhesive layer 1014 may be a single-sided adhesive tape, which is generally a commercially available transparent film that can be decomposed by heat or UV light. The first adhesive layer 1014 can temporarily support and fix the first device 1041. Preferably, the first device is a passive device.

Figure 4C:
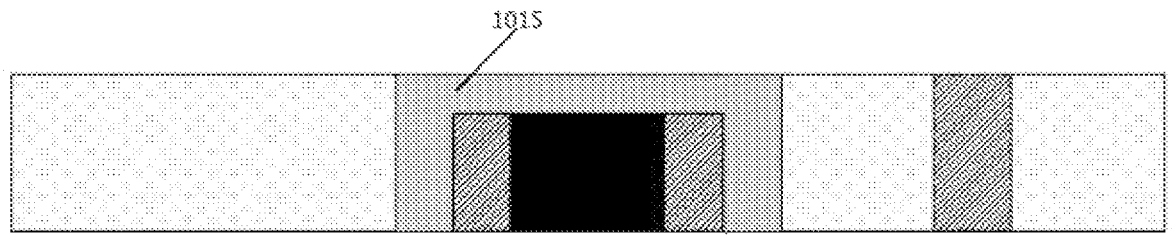

Then, a packaging material is laminated on the upper surface of the first insulating layer 101 and in a gap between the first device 1041 and the first device placement mouth fame 1013, and cured to from a first packaging layer 1015; and the first packaging layer 1015 is thinned to expose the end of the first conductive copper pillar layer 1012, and the first adhesive layer 1014 is removed, as shown in FIG. 4C. Generally, the first adhesive layer 1014 can be removed by means of ultraviolet light irradiation or thermal decomposition. The packaging material may be selected from a thermosetting dielectric material or a photosensitive dielectric material. Preferably, the thermosetting resin material is laminated, and cured by heating to form the first packaging layer 1015; and the first packaging layer 1015 may be entirely thinned by means of plasma etching or grinding to expose the end of the first conductive copper pillar layer 1012.

Figure 4D:
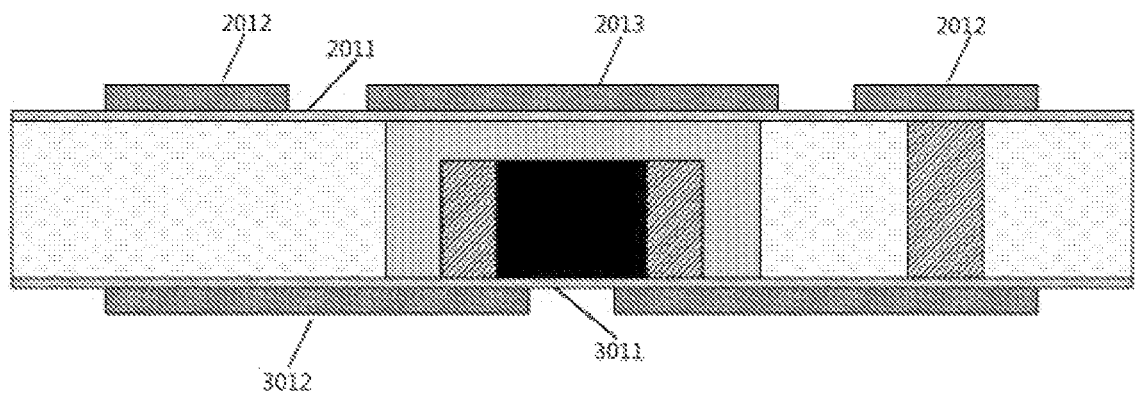

Next, a first circuit layer and a second circuit layer 3012 are formed on upper and lower surfaces of the first insulating layer 101, wherein the first circuit layer includes a first conductive circuit layer 2012 and a first sacrificial circuit layer 2013; the first sacrificial circuit layer 2013 covers the first device placement mouth frame 1013, a terminal of the first device 1041 is communicated with the second circuit layer 3012, and the first conductive circuit layer 2012 and the second circuit layer 3012 are conductively connected through the first conductive copper pillar layer 1012, as shown in FIG. 4D. In general cases, the method includes the following steps:

forming a first metal seed layer 2011 and a second metal seed layer 3011 on upper and lower surfaces of the first insulating layer 101, respectively;

applying a first photoresist layer on the first metal seed layer 2011, and applying a second photoresist layer on the second metal seed layer 3011;

exposing and developing the first photoresist layer and the second photoresist layer to form a first feature pattern and a second feature pattern respectively;

forming a first circuit layer by electroplating in the first feature pattern, and forming a second circuit layer 3012 by electroplating in the second feature pattern; and removing the first photoresist layer and the second photoresist layer.

Generally, the metal seed layer may be formed by electroless plating or sputtering, and the metal seed layer may respectively include titanium, copper, titanium-tungsten alloy or a combination thereof. Preferably, the first metal seed layer 2011 and the second metal seed layer 3011 are formed by sputtering titanium and copper. The first circuit layer and the second circuit layer 3012 are formed by electroplating copper in the first feature pattern and the second feature pattern, respectively. The thickness of the first circuit layer and the second circuit layer can be determined according to actual needs. The number of sacrificial circuits included in the first sacrificial circuit layer 2013 in the first circuit layer can be determined according to the actual number of devices to be embedded.

Figure 4E:
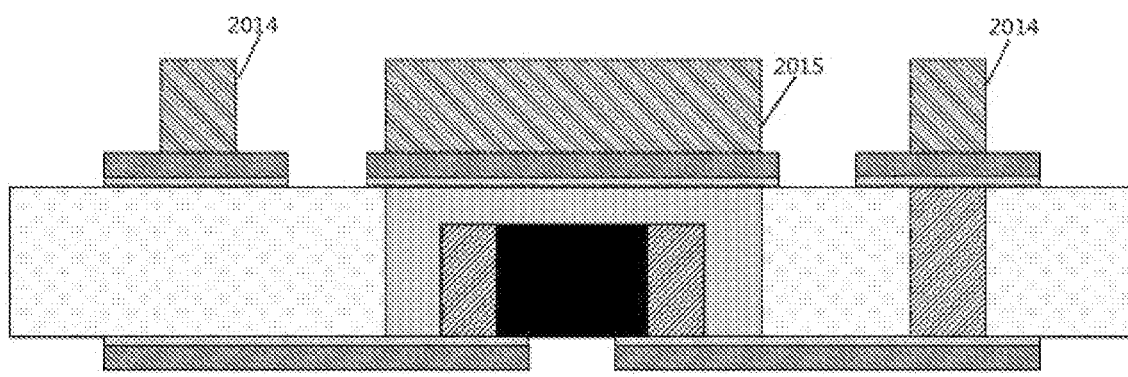
Figure 4F:
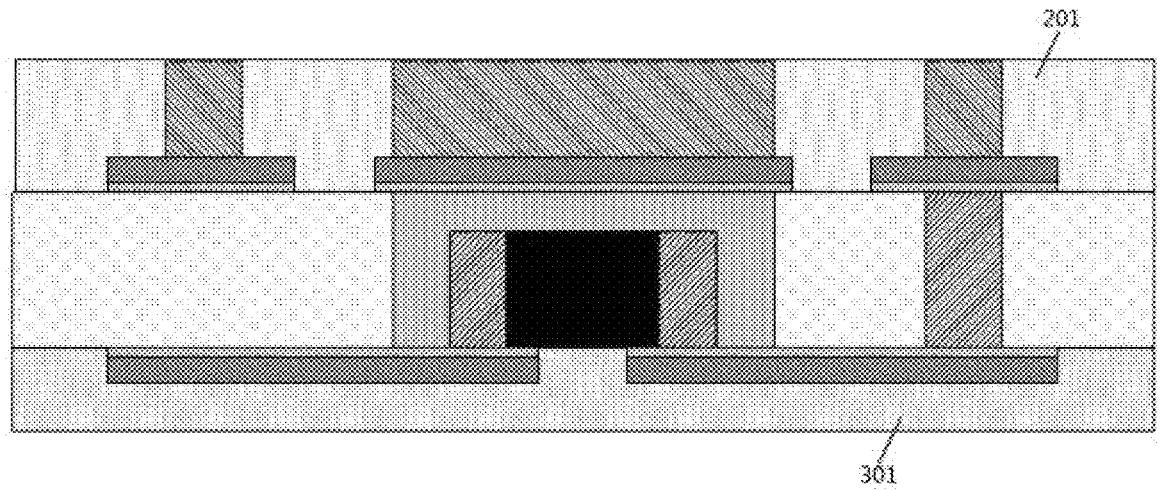

Then, a second copper pillar layer is formed on the first circuit layer, the second copper pillar layer including a second conductive copper pillar layer 2014 and a second sacrificial copper pillar layer 2015, wherein the second sacrificial copper pillar layer 2015 is located on the first sacrificial circuit layer 2013, as shown in FIG. 4E. In general cases, the method includes the following steps:

applying a third photoresist layer on the first circuit layer, and exposing and developing the third photoresist layer to form a third feature pattern;

electroplating copper in the third feature pattern to form a second copper pillar layer;

removing the third photoresist layer, and etching the exposed first metal seed layer 2011 and second metal seed layer 3011; and next, laminating an insulating material on the first circuit layer and the second copper pillar layer, thinning the insulating material to expose the end of the second copper pillar layer to form a second insulating layer 201, and laminating the insulating material on the second circuit layer 3012 to form a third insulating layer 301, as shown in FIG. 4F. Preferably, the second insulating layer is made of resin containing glass fiber, and the third insulating layer is made of pure resin. Generally, the insulating material may be entirely thinned, for example, the insulating material may be entirely thinned by grinding or plasma etching. Alternatively, the insulating material may also be partially thinned, for example, the insulating material on the second copper pillar layer may be partially thinned by means of laser or mechanical drilling to expose the end of the second copper pillar layer. Preferably, the insulating material is entirely thinned by means of grinding or plasma etching to expose the end of the second copper pillar layer.

Figure 4G:
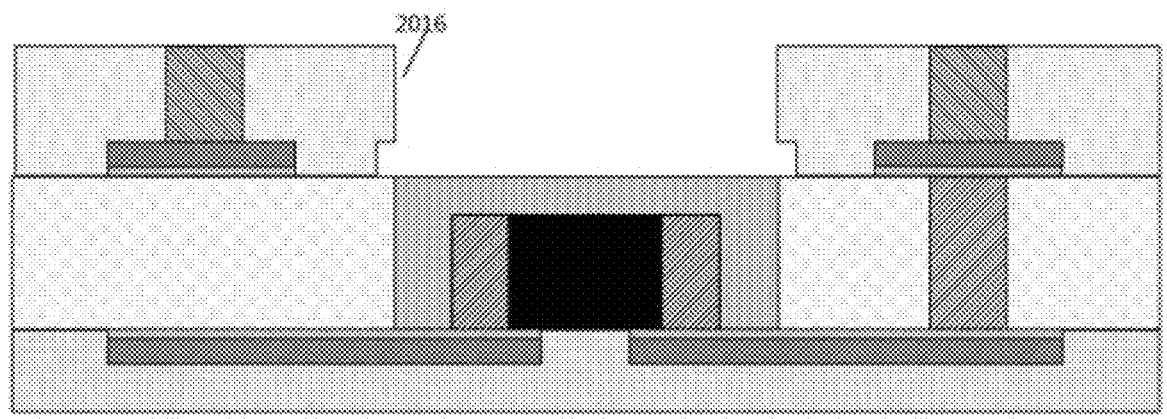

Then, the first sacrificial circuit layer 2013 and the second sacrificial copper pillar layer 2015 are etched to form a second device placement mouth frame 2016, wherein the second device placement mouth frame 2016 is vertically overlapped with the first device placement mouth frame 1013, as shown in FIG. 4G. Generally, the method may include the following steps:

applying a fourth photoresist layer on the upper surface of the second insulating layer 201;

exposing and developing to form a fourth feature pattern, and exposing the end of the second sacrificial copper pillar layer 2015;

etching the second sacrificial copper pillar layer 2015 and the first sacrificial copper pillar layer 2013 to form a second device placement mouth frame 2016; and removing the fourth photoresist layer.

Figure 4H:
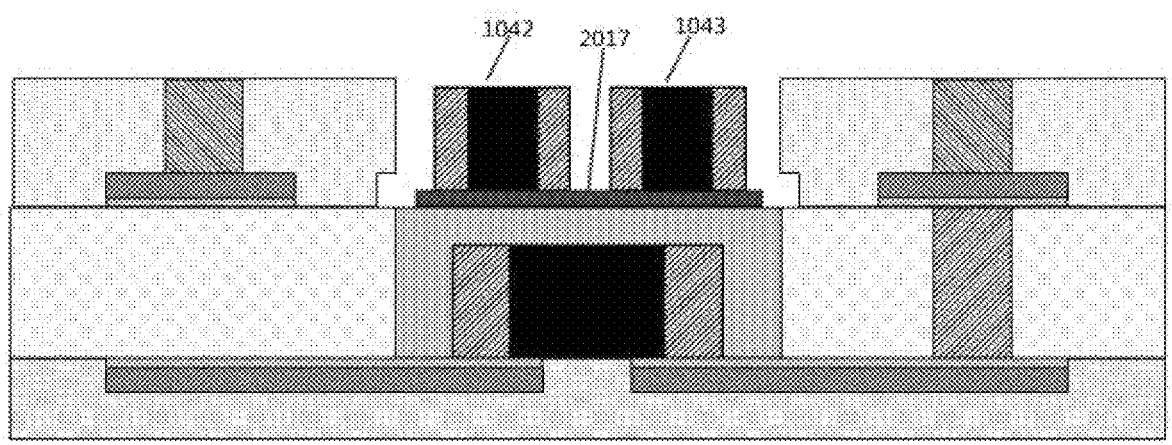

Next, a second device 1042 and a third device 1043 are mounted onto the second device placement mouth frame 2016, wherein the second device 1042 and the third device 1043 are vertically overlapped with the first device 1041 respectively in a layered manner, as shown in FIG. 4H. In general cases, an adhesive material 2017 is arranged at the bottom of the second device placement mouth frame 2016, and the backside of the second device 1042 and the backside of the third device 1043 are then mounted onto the adhesive material 2017 respectively, such that the second device 1042 and the third device 1043 are mounted onto the bottom of the second device placement mouth frame 2016. Alternatively, the adhesive material 2017 is arranged at the backside of the second device 1042 and the backside of the third device 1043 respectively, and the backside of the second device 1042 and the backside of the third device 1043 are mounted onto the bottom of the second device placement mouth frame 2016 respectively, such that the second device 1042 and the third device 1043 are mounted onto the bottom of the second device placement mouth frame 2016. Preferably, the second device 1042 and the third device 1043 are respectively passive components.

Figure 4I:
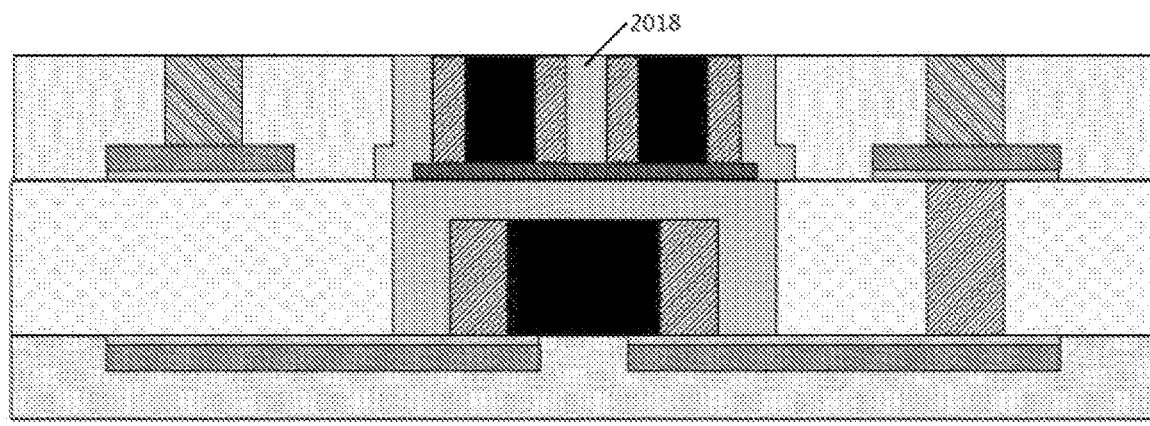

Next, a second packaging layer 2018 is formed in a gap between the second device placement mouth frame 2016 and the second device 1042 and in a gap between the second device placement mouth frame 2016 and the third device 1043, as shown in FIG. 4I. In general cases, this method includes the following steps:

laminating a packaging material on the upper surface of the second insulating layer 201, and in a gap between the second device placement mouth fame 2016 ad the second device 1042 and in a gap between the second device placement mouth frame 2016 and the third device 1043; curing the packaging material to from a second packaging layer 2018; and thinning the second packaging layer 2018 to expose the end of the second conductive copper pillar layer 2014, a terminal of the second device 1042 and a terminal of the third device 1043.

Preferably, a thermosetting resin material is laminated, and cured by heating to form the second packaging layer 2018; and the second packaging layer 2018 may be entirely thinned by means of plasma etching or grinding to expose the ends of the second conductive copper pillar layer 2014, the second device 1042 and the third device 1043.

Figure 4J:
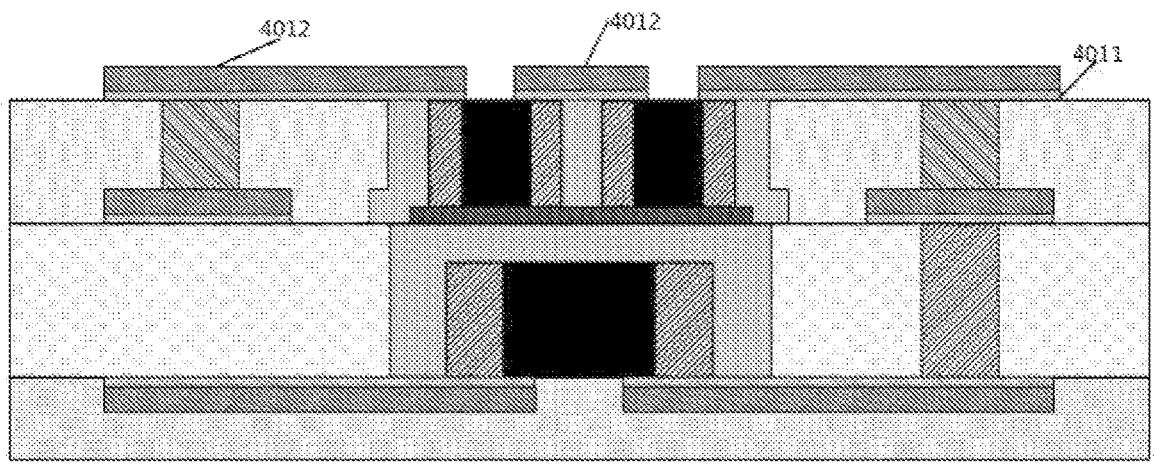

Then, a third circuit layer 4012 is formed on the upper surface of the second insulating layer 201, wherein the terminal of the second device 1042 and the terminal of the third device 1043 are respectively communicated with the third circuit layer 4012, and the first conductive circuit layer 2012 and the third circuit layer 4012 are conductively connected through the second conductive copper pillar layer 2014, as shown in FIG. 4J. In general cases, this method may include the following steps:

forming a third metal seed layer 4011 on the upper surface of the second insulating layer 201;

applying a fifth photoresist layer on the third metal seed layer 4011, and exposing and developing to form a fifth feature pattern;

electroplating copper in the fifth feature pattern to form a third circuit layer 4012; and removing the fifth photoresist layer, and etching the exposed third metal seed layer 4011.

Preferably, the third metal seed layer 4011 is manufactured by sputtering titanium and copper.

Figure 4K:
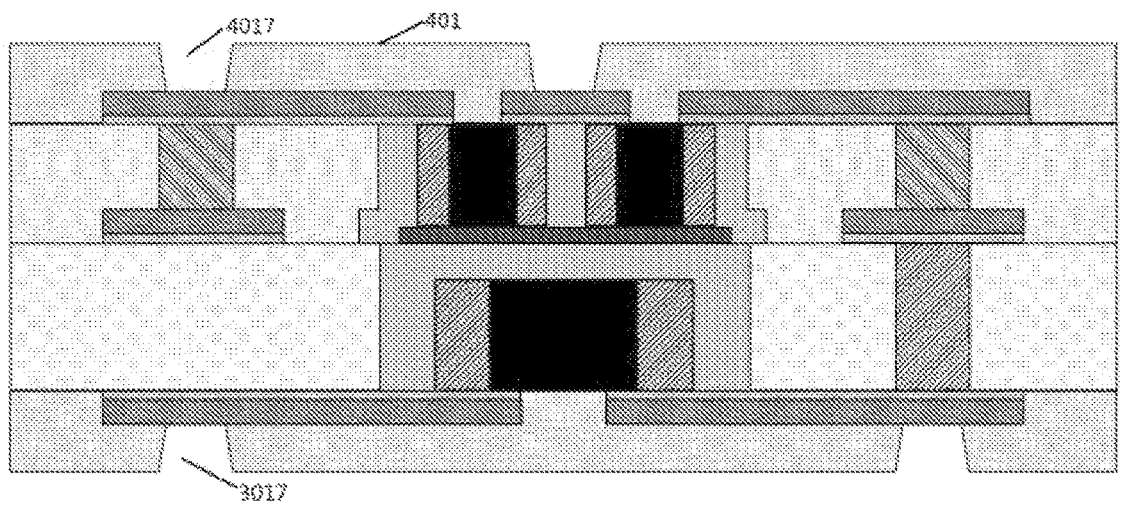

Next, an insulating material is laminated on the third circuit layer 4012 to form a fourth insulating layer 401, and a first blind hole 3017 and a second blind hole 417 are formed respectively in the third insulating layer 301 and the fourth insulating layer 401, as shown in FIG. 4K. In general cases, the blind holes may be formed by means of laser processing. Preferably, the fourth insulating layer is made of pure resin.

Figure 4L:
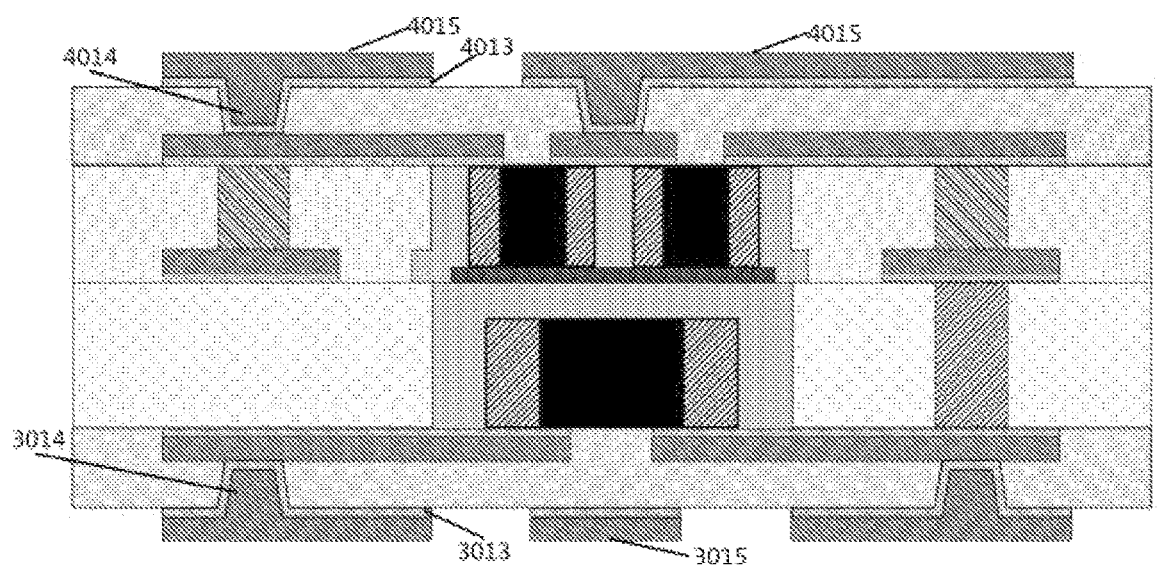

Then, a first via hole 3014 and a fifth circuit layer 3015 are formed in the first blind hole 3017 and in the surface of the third insulating layer 301 respectively, and a second via hole 4014 and a fourth circuit layer 4015 are formed in the second blind hole 4017 and in the surface of the fourth insulating layer 401 respectively, wherein the second circuit layer 3012 and the fifth circuit layer 3015 are conductively connected through the first via hole 3014, and the third circuit layer 4012 and the fourth circuit layer 4015 are conductively connected via the second via hole 4014, as shown in FIG. 4L. In general cases, this method further includes the following steps:

forming a fifth metal seed layer 3013 on the bottom and sidewalls of the first blind hole 3017 and the surface of the third insulating layer 301, and forming a fourth metal seed layer 4013 on the bottom and sidewalls of the second blind hole 4017 and the surface of the fourth insulating layer 401;

applying a sixth photoresist layer on the fourth metal seed layer 4013, applying a seventh photoresist layer on the fifth metal seed layer 3013, and exposing and developing the sixth photoresist layer and the seventh photoresist layer respectively to form a sixth feature pattern and a seventh feature pattern; and electroplating copper in the sixth feature pattern to form the second via hole 4014 and the fourth circuit layer 4015, and electroplating copper in the seventh feature pattern to form the first via hole 3014 and the fifth circuit layer 3015; and removing the sixth photoresist layer and the seventh photoresist layer, and etching the exposed fourth metal seed layer 4013 and fifth metal seed layer 3013.

Preferably, the fourth metal seed layer 4013 and the fifth metal seed layer 3013 are formed by sputtering titanium and copper.

Figure 4M:
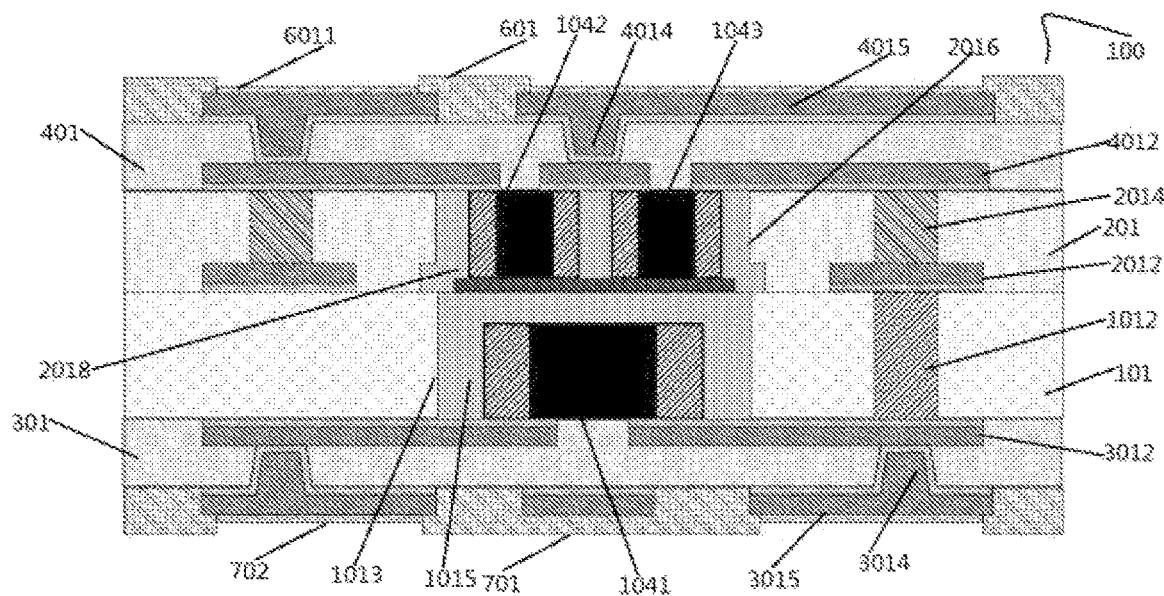

Finally, a first solder resist layer 601 is formed on the fourth circuit layer 4015, a second solder resist layer 701 is formed on the fifth circuit layer, and exposed metal surfaces in the first solder resist layer 601 and the second solder resist layer 701 are respectively treated to form a first metal surface treatment layer 6011 and a second metal surface treatment layer 7011, as shown in FIG. 4M. Generally, the first metal surface treatment layer 6011 and the second metal surface treatment layer 7011 may be formed by means of anti-oxidation, ENEPIG (Electroless Nickel Electroless Palladium Immersion Gold), tin plating, electroless silver plating, etc.

The present invention further provides a method for manufacturing a structure for embedding and packaging multiple devices by layer 200. The method for manufacturing the packaging structure 200 differs from the method for manufacturing the packaging structure 100 in that: 1) the first device 1041 is mounted onto the top of the first device placement mouth frame 1013; 2) after the first packaging layer 1015 is formed, a fifth insulating layer 501 is formed on the upper surface of the first insulating layer 101, wherein the fifth insulating layer 501 includes a sixth circuit layer 5012 located in the lower surface of the fifth insulating layer 501 and a third conductive copper pillar layer 5013 located on the sixth circuit layer 5012, the terminal of the first device 1041 is communicated with the sixth circuit layer 5012, and the sixth circuit layer 5012 and the second circuit layer 3012 are conductively connected through the first conductive copper pillar layer 1012; 3) a first circuit layer including a first conductive circuit layer 2012 and a first sacrificial circuit layer 2013 is formed on the fifth insulating layer 501, wherein the first conductive circuit layer 2012 and the sixth circuit layer 5012 are conductively connected through the third conductive copper pillar layer 5013; 4) the second packaging layer 2018 is formed on the upper surface of the second insulating layer 201 and in a gap between the second device placement mouth frame 2016 and the second device 1042 and in a gap between the second device placement mouth frame 2016 and the third device 1043; and 5) a third via hole 2019 is formed in the second packaging layer 2018, the terminal of the second device 1042 and the terminal of the third device 1043 are conductively connected to the third circuit layer 4012 respectively through the third via hole 2019, and the first conductive circuit layer 2012 and the third conductive circuit layer 4012 are conductively connected through the second conductive copper pillar layer 2014 and the third via hole 2019.

The other steps in the method for manufacturing the packaging structure 200 are the same as the corresponding steps in the method for manufacturing the packaging structure 100, and are not repeated here.

Those skilled in the art will recognize that the present invention is not limited to specific drawings and description in the context. In addition, the scope of the present invention is defined by the appended claims and includes combinations and sub-combinations of the various technical features described above, as well as variations and modifications thereof, which will be envisioned by those skilled in the art upon reading the foregoing description.

In the claims, the term "comprising" and variations such as "including", "containing", etc., means that the listed elements are included, but generally do not exclude other elements.

What is claimed is:

1. A method for manufacturing a structure for embedding and packaging multiple devices by layer, the method comprising:
    (a) preparing a polymer supporting frame, the polymer supporting frame comprising a first insulating layer, a first conductive copper pillar layer penetrating the first insulating layer, and a first device placement mouth frame;
    (b) mounting a first device onto the bottom of the first device placement mouth frame, and forming a first packaging layer in a gap between the first device placement mouth frame and the first device;
    (c) respectively forming a first circuit layer and a second circuit layer on upper and lower surfaces of the first insulating layer, the first circuit layer comprising a first conductive circuit layer and a first sacrificial circuit layer, wherein the first sacrificial circuit layer covers the first device placement mouth frame, a terminal of the first device is communicated with the second circuit layer, and the first conductive circuit layer and the second circuit layer are conductively connected through the first conductive copper pillar layer;
    (d) forming a second copper pillar layer on the first circuit layer, the second copper pillar layer comprising a second conductive copper pillar layer and a second sacrificial copper pillar layer, wherein the second sacrificial copper pillar layer is located on the first sacrificial circuit layer;
    (e) laminating an insulating material on the first circuit layer and the second copper pillar layer, thinning the insulating material to expose the end of the second copper pillar layer to form a second insulating layer, and laminating the insulating material on the second circuit layer to form a third insulating layer;
    (f) etching the first sacrificial circuit layer and the second sacrificial copper pillar layer to form a second device placement mouth frame, wherein the second device placement mouth frame is vertically overlapped with the first device placement mouth frame;
    (g) mounting a second device and a third device onto the bottom of the second device placement mouth frame, and forming a second packaging layer in a gap between the second device placement mouth frame and the second device and in a gap between the second device placement mouth frame and the third device, wherein the second device and the third device are vertically overlapped with the first device respectively; and
    (h) forming a third circuit layer on the upper surface of the second insulating layer, wherein a terminal of the second device and a terminal of the third device are respectively communicated with the third circuit layer, and the first conductive circuit layer and the third circuit layer are conductively connected through the second conductive copper pillar layer.

2. The method for manufacturing according to claim 1, further comprising:
    (i) following step (h), laminating an insulating material on the third circuit layer to form a fourth insulating layer, and forming a first blind hole and a second blind hole in the third insulating layer and the fourth insulating layer, respectively;
    (j) forming a first via hole and a fifth circuit layer in the first blind hole and in the surface of the third insulating layer respectively, and forming a second via hole and a fourth circuit layer in the second blind hole and in the surface of the fourth insulating layer respectively, wherein the second circuit layer and the fifth circuit layer are conductively connected through the first via hole, and the third circuit layer and the fourth circuit layer are conductively connected through the second via hole; and
    (k) forming a first solder resist layer on the fourth circuit layer, forming a second solder resist layer on the fifth circuit layer, and treating exposed metal surfaces in the first solder resist layer and the second solder resist layer respectively to form a first metal surface treatment layer and a second metal surface treatment layer.

3. The method for manufacturing according to claim 2, wherein step (i) comprises: forming the blind holes by means of laser processing.

4. The method for manufacturing according to claim 2, wherein the insulating material is selected from pure resin or resin containing glass fiber.

5. The method for manufacturing according to claim 1, wherein step (b) comprises:
    (b1) arranging a first adhesive layer on the bottom of the first insulating layer;

(b2) attaching a terminal surface of the first device to the first adhesive layer exposed in the first device placement mouth frame;

(b3) laminating a packaging material on the upper surface of the first insulating layer and in a gap between the first device and the first device placement mouth frame, and curing the packaging material to form a first packaging layer;

(b4) thinning the first packaging layer to expose the end of the first conductive copper pillar layer; and (b5) removing the first adhesive layer.

6. The method for manufacturing according to claim 5, wherein the first adhesive layer includes a single-sided adhesive tape.

7. The method for manufacturing according to claim 1, wherein step (g) comprises: arranging an adhesive material at the bottom of the second device placement mouth frame, and then mounting the backside of the second device and the backside of the third device onto the adhesive material respectively, such that the second device and the third device are mounted onto the bottom of the second device placement mouth frame.

8. The method for manufacturing according to claim 1, wherein step (g) comprises: arranging an adhesive material at the backside of the second device and the backside of the third device respectively, and then mounting the backside of the second device and the backside of the third device onto the bottom of the second device placement mouth frame respectively, such that the second device and the third device are mounted onto the bottom of the second device placement mouth frame.

9. The method for manufacturing according to claim 1, wherein the first packaging layer and the second packaging layer are respectively selected from a thermosetting dielectric material or a photosensitive dielectric material.

10. The method for manufacturing according to claim 1, wherein the first device, the second device and the third device respectively comprise one or more of an active device and a passive device.

11. A structure for embedding and packaging multiple devices by layer, which is manufactured by the method of claim 1.

12. The structure for embedding and packaging multiple devices by layer according to claim 11, comprising a first insulating layer and a second insulating layer located above the first insulating layer; the first insulating layer comprises a first conductive copper pillar layer and a first device placement mouth frame which penetrate the first insulating layer in a height direction, wherein a first device is mounted onto the bottom of the first device placement mouth frame, and a first packaging layer is arranged in a gap between the first device placement mouth frame and the first device; the second insulating layer comprises a second device placement mouth frame, a first conductive circuit layer located in the lower surface of the second insulating layer, and a second conductive copper pillar layer located on the first conductive circuit layer, wherein a second device and a third device are mounted onto the bottom of the second device placement mouth frame, a second packaging layer is arranged in a gap between the second device placement mouth frame and the second device and in a gap between the second device placement mouth frame and the third device, and the first device placement mouth frame is vertically overlapped with the second device placement mouth frame; and the first device is vertically overlapped with the second device and the third device in a layered manner.

13. The structure for embedding and packaging multiple devices by layer according to claim 12, further comprising a third insulating layer located below the first insulating layer and a fourth insulating layer located above the second insulating layer, wherein the third insulating layer comprises a second circuit layer located in the upper surface of the third insulating layer, a first via hole in the second circuit layer, and a fifth circuit layer located on the lower surface of the third insulating layer; the second circuit layer and the fifth circuit layer are conductively connected through the first via hole; the first conductive circuit layer and the second circuit layer are conductively connected through the first conductive copper pillar layer; and a terminal of the first device is communicated with the second circuit layer; and the fourth insulating layer comprises a third circuit layer located in the lower surface of the fourth insulating layer, a second via hole in the third circuit layer, and a fourth circuit layer on the upper surface of the fourth insulating layer, wherein a terminal of the second device and a terminal of the third device are respectively communicated with the third circuit layer, the third circuit layer and the fourth circuit layer are conductively connected through the second via hole, and the first conductive circuit layer and the third circuit layer are conductively connected through the second conductive copper pillar layer.

14. The structure for embedding and packaging multiple devices by layer according to claim 13, further comprising a first solder resist layer and a second solder resist layer which are respectively formed on the fourth circuit layer and the fifth circuit layer, wherein a first metal surface treatment layer is arranged in the first solder resist layer, and a second metal surface treatment layer is arranged in the second solder resist layer.

15. A method for manufacturing a structure for embedding and packaging multiple devices by layer, the method comprising:

(a) preparing a polymer supporting frame, the polymer supporting frame comprising a first insulating layer, a first conductive copper pillar layer penetrating the first insulating layer, and a first device placement mouth frame;

(b) mounting a first device onto the top of the first device placement mouth frame, and forming a first packaging layer in a gap between the first device placement mouth frame and the first device;

(c) forming a second circuit layer on the lower surface of the first insulating layer, and a fifth insulating layer on the upper surface of the first insulating layer, wherein the fifth insulating layer comprises a sixth circuit layer located in the lower surface of the fifth insulating layer and a third conductive copper pillar layer located on the sixth circuit layer, a terminal of the first device is communicated with the sixth circuit layer, and the sixth circuit layer and the second circuit layer are conductively connected through the first conductive copper pillar layer;

(d) forming a first circuit layer on the upper surface of the fifth insulating layer, the first circuit layer comprising a first conductive circuit layer and a first sacrificial circuit layer, wherein the first conductive circuit layer and the sixth circuit layer are conductively connected through the third conductive copper pillar layer, and the positions of the first sacrificial circuit layer and the first device placement mouth frame in a longitudinal direction are the same;

(e) forming a second copper pillar layer on the first circuit layer, the second copper pillar layer comprising a second conductive copper pillar layer and a second sacrificial copper pillar layer, wherein the second sacrificial copper pillar layer is located on the first sacrificial circuit layer;

(f) laminating an insulating material on the first circuit layer and the second copper pillar layer, thinning the insulating material to expose the end of the second copper pillar layer to form a second insulating layer, and laminating the insulating material on the second circuit layer to form a third insulating layer;

(g) etching the first sacrificial circuit layer and the second sacrificial copper pillar layer to form a second device placement mouth frame, wherein the second device placement mouth frame is vertically overlapped with the first device placement mouth frame;

(h) mounting a second device and a third device onto the bottom of the second device placement mouth frame, and forming a second packaging layer on the upper surface of the second insulating layer, and in a gap between the second device placement mouth frame and the second device and in a gap between the second device placement mouth frame and the third device, wherein the first device is vertically overlapped with the second device and the third device in a layered manner; and (i) forming a third blind hole in the second packaging layer, forming a third via hole in the third blind hole, and forming a third circuit layer on the surface of the second packaging layer and the surface of the third via hole, wherein a terminal of the second device and a terminal of the third device are conductively connected to the third circuit layer respectively through the third via hole, and the first conductive circuit layer and the third circuit layer are conductively connected through the second conductive copper pillar layer and the third via hole.

16. The method for manufacturing according to claim 15, further comprising:

(j) following step (i), laminating an insulating material on the third circuit layer to form a fourth insulating layer, and forming a first blind hole and a second blind hole in the third insulating layer and the fourth insulating layer, respectively;

(k) forming a first via hole and a fifth circuit layer in the first blind hole and in the surface of the third insulating layer respectively, and forming a second via hole and a fourth circuit layer in the second blind hole and in the surface of the fourth insulating layer respectively, wherein the second circuit layer and the fifth circuit layer are conductively connected through the first via hole, and the third circuit layer and the fourth circuit layer are conductively connected through the second via hole; and (l) forming a first solder resist layer on the fourth circuit layer, forming a second solder resist layer on the fifth circuit layer, and treating exposed metal surfaces in the first solder resist layer and the second solder resist layer respectively to form a first metal surface treatment layer and a second metal surface treatment layer.

17. A structure for embedding and packaging multiple devices by layer, which is manufactured by the method of claim 15.

18. The structure for embedding and packaging multiple devices by layer according to claim 17, comprising a first insulating layer, a fifth insulating layer located above the insulating layer and a second insulating layer located above the fifth insulating layer; the first insulating layer comprises a first conductive copper pillar layer and a first device placement mouth frame which penetrate the first insulating layer in a height direction, wherein a first device is mounted onto the bottom of the first device placement mouth frame, and a first packaging layer is arranged in a gap between the first device placement mouth frame and the first device; the fifth insulating layer comprises a sixth circuit layer located in the lower surface of the fifth insulating layer, and a third conductive copper pillar layer located on the sixth circuit layer; the second insulating layer comprises a second device placement mouth frame, a first conductive circuit layer located in the lower surface of the second insulating layer, and a second conductive copper pillar layer located on the first conductive circuit layer, wherein a second device and a third device are mounted onto the bottom of the second device placement mouth frame, a second packaging layer is arranged on the upper surface of the second insulating layer, and in a gap between the second device placement mouth frame and the second device and in a gap between the second device placement mouth frame and the third device; the sixth circuit layer and the first conductive circuit layer are conductively connected through the third conductive copper pillar layer; a terminal of the first device is communicated with the sixth circuit layer; the first device placement mouth frame is vertically overlapped with the second device placement mouth frame; and the first device is vertically overlapped with the second device and the third device in a layered manner.

19. The structure for embedding and packaging multiple devices by layer according to claim 18, further comprising a third insulating layer located below the first insulating layer and a fourth insulating layer located above the second insulating layer, wherein the third insulating layer comprises a second circuit layer located in the upper surface of the third insulating layer, a first via hole in the second circuit layer, and a fifth circuit layer located on the lower surface of the third insulating layer; the second circuit layer and the fifth circuit layer are conductively connected through the first via hole; the sixth conductive circuit layer and the second circuit layer are conductively connected through the first conductive copper pillar layer; and the fourth insulating layer comprises a third circuit layer located in the lower surface of the fourth insulating layer, a second via hole in the third circuit layer, and a fourth circuit layer located on the upper surface of the fourth insulating layer, wherein the third circuit layer and the fourth circuit layer are conductively connected through the second via hole; a third via hole is formed in the second packaging layer; a terminal of the second device and a terminal of the third device are conductively connected to the third circuit layer respectively through the third via hole; and the first conductive circuit layer and the third circuit layer are conductively connected through the second conductive copper pillar layer and the third via hole.

20. The structure for embedding and packaging multiple devices by layer according to claim 19, further comprising a first solder resist layer and a second solder resist layer which are respectively formed on the fourth circuit layer and the fifth circuit layer, wherein a first metal surface treatment layer is arranged in the first solder resist layer, and a second metal surface treatment layer is arranged in the second solder resist layer.

\* \* \* \* \*